United States Patent
Hiraoka et al.

(10) Patent No.: US 9,287,488 B2
(45) Date of Patent: Mar. 15, 2016

(54) PIEZOELECTRIC ACTUATOR DEVICE AND METHOD FOR MANUFACTURING SAME

(71) Applicant: PANASONIC CORPORATION, Osaka (JP)

(72) Inventors: Soichiro Hiraoka, Hyogo (JP); Kazuki Komaki, Osaka (JP); Shinsuke Nakazono, Osaka (JP); Akira Kurozuka, Osaka (JP); Toshiaki Horie, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 141 days.

(21) Appl. No.: 14/362,574

(22) PCT Filed: Jan. 29, 2013

(86) PCT No.: PCT/JP2013/000455
§ 371 (c)(1),
(2) Date: Jun. 3, 2014

(87) PCT Pub. No.: WO2013/114857
PCT Pub. Date: Aug. 8, 2013

(65) Prior Publication Data
US 2014/0368087 A1 Dec. 18, 2014

(30) Foreign Application Priority Data
Jan. 31, 2012 (JP) ................................. 2012-017685

(51) Int. Cl.
*H01L 41/08* (2006.01)
*H01L 41/083* (2006.01)
(Continued)

(52) U.S. Cl.
CPC ............ *H01L 41/083* (2013.01); *B06B 1/0603* (2013.01); *G01C 19/5621* (2013.01);
(Continued)

(58) Field of Classification Search
CPC . H01L 41/083; H01L 41/042; H01L 41/0471; H01L 41/053; H01L 41/0913; H01L 41/094; H01L 41/22; H01L 41/27; H01L 41/297

USPC .......................................... 310/328, 364, 365
See application file for complete search history.

(56) References Cited

U.S. PATENT DOCUMENTS 8,649,078 B2 * 2/2014 Aimono ............. G02B 26/0858
                                                        359/199.4
8,649,080 B2 * 2/2014 Tani ..................... G02B 26/101
                                                        359/199.4

(Continued)

FOREIGN PATENT DOCUMENTS

JP 2001-024460 A 1/2001
JP 2009-093120 A 4/2009

(Continued)

OTHER PUBLICATIONS

International Search Report issued in PCT/JP2013/000455, dated Apr. 23, 2013, with English translation.

*Primary Examiner* — J. San Martin
(74) *Attorney, Agent, or Firm* — McDermott Will & Emery LLP

(57) ABSTRACT

A piezoelectric actuator device includes a vibrator and a driver to vibrate the vibrator. The vibrator includes a lower vibration layer configured to vibrate and an upper vibration layer coupled to an upper surface of the lower vibration layer and configured to vibrate together with the lower vibration layer. The driver includes an upper electrode layer on a lower surface of the lower vibration layer, a piezoelectric layer on a lower surface of the upper electrode layer, and a lower electrode layer on a lower surface of the piezoelectric layer. The lower vibration layer of the vibrator is made of organic material. The upper vibration layer is mainly made of inorganic material. The lower vibration layer has a smaller longitudinal elastic modulus than the upper vibration layer. The piezoelectric actuator device has a large resistance to disturbance vibrations and a large warping amount of the vibrator without increasing power consumption.

14 Claims, 15 Drawing Sheets

(51) Int. Cl.
| | |
|---|---|
| *H01H 57/00* | (2006.01) |
| *H01L 41/22* | (2013.01) |
| *G02B 26/08* | (2006.01) |
| *G01C 19/5621* | (2012.01) |
| *G01C 19/5628* | (2012.01) |
| *H01L 41/09* | (2006.01) |
| *H01L 41/04* | (2006.01) |
| *H01L 41/047* | (2006.01) |
| *H01L 41/053* | (2006.01) |
| *H01L 41/27* | (2013.01) |
| *H01L 41/297* | (2013.01) |
| *B06B 1/06* | (2006.01) |

(52) U.S. Cl.
CPC ........ *G01C19/5628* (2013.01); *G02B 26/0858* (2013.01); *H01H 57/00* (2013.01); *H01L 41/042* (2013.01); *H01L 41/0471* (2013.01); *H01L 41/053* (2013.01); *H01L 41/094* (2013.01); *H01L 41/0913* (2013.01); *H01L 41/0953* (2013.01); *H01L 41/22* (2013.01); *H01L 41/27* (2013.01); *H01L 41/297* (2013.01); *H01H 2057/006* (2013.01); *Y10T 29/42* (2015.01)

(56) References Cited

U.S. PATENT DOCUMENTS

| | | | | |
|---|---|---|---|---|
| 8,654,426 B2* | 2/2014 | Yamada | ............ | G02B 26/0858 359/212.1 |
| 8,841,821 B2* | 9/2014 | Aimono | ............ | H02N 2/0075 310/317 |
| 9,151,947 B2* | 10/2015 | Aimono | ............ | G02B 26/08 |
| 2002/0174542 A1 | 11/2002 | Watanabe et al. | | |
| 2007/0158552 A1* | 7/2007 | Kim | ............ | G02B 26/0841 250/306 |
| 2009/0180167 A1* | 7/2009 | Tani | ............ | G02B 26/105 359/198.1 |
| 2010/0038998 A1 | 2/2010 | Onishi et al. | | |
| 2010/0245966 A1* | 9/2010 | Yasuda | ............ | H01L 41/0953 359/224.1 |
| 2011/0032590 A1* | 2/2011 | Terada | ............ | G02B 26/0858 359/199.4 |
| 2011/0122471 A1* | 5/2011 | Terada | ............ | B81B 3/0086 359/199.1 |
| 2011/0292479 A1* | 12/2011 | Hiraoka | ............ | G02B 26/0858 359/199.1 |
| 2012/0033279 A1* | 2/2012 | Furukawa | ............ | G02B 26/0833 359/199.1 |
| 2012/0038714 A1 | 2/2012 | Harigai et al. | | |
| 2012/0243065 A1* | 9/2012 | Koyama | ............ | F21S 48/1145 359/199.4 |
| 2012/0320440 A1* | 12/2012 | Kotera | ............ | G02B 26/0841 359/224.1 |
| 2012/0327495 A1* | 12/2012 | Aimono | ............ | G02B 26/101 359/224.1 |
| 2013/0050791 A1* | 2/2013 | Nakazono | ............ | G02B 26/0841 359/199.4 |

FOREIGN PATENT DOCUMENTS

| | | |
|---|---|---|
| JP | 2009-193804 A | 8/2009 |
| JP | 4835813 B1 | 10/2011 |
| WO | 00-71345 A1 | 11/2000 |
| WO | 2008-084806 A1 | 7/2008 |
| WO | 2009-130902 A1 | 10/2009 |
| WO | 2011-129072 A1 | 10/2011 |

* cited by examiner

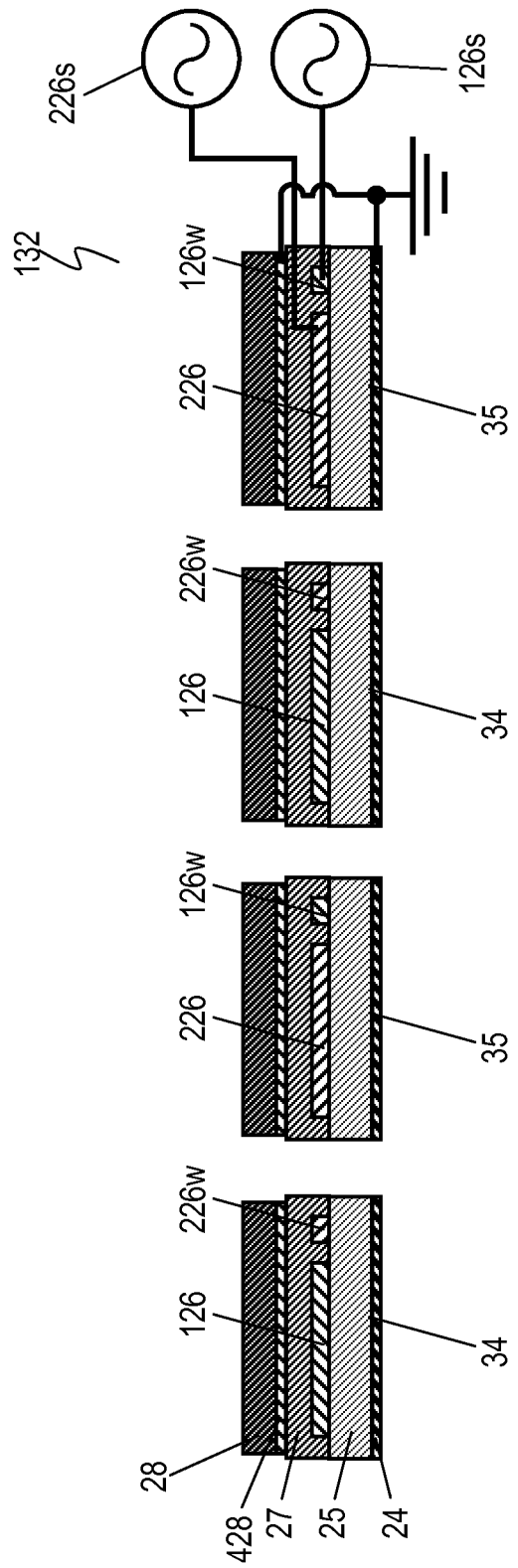

PIEZOELECTRIC ACTUATOR DEVICE AND METHOD FOR MANUFACTURING SAME

RELATED APPLICATIONS

This application is the U.S. National Phase under 35 U.S.C. §371 of International Application No. PCT/JP2013/000455, filed on Jan. 29, 2013, which in turn claims the benefit of Japanese Application No. 2012-017685, filed on Jan. 31, 2012, the disclosures of which Applications are incorporated by reference herein.

TECHNICAL FIELD

The present invention relates to a piezoelectric actuator device and a method for manufacturing the device.

BACKGROUND ART

In a conventional piezoelectric actuator device, a driver including a lower electrode layer, a piezoelectric layer formed on the lower electrode layer, and an upper electrode layer formed on the piezoelectric layer is provided on a vibrator.

Upon having an electric field between the lower electrode layer and the upper electrode layer, the piezoelectric layer expands and shrinks in a surface direction, and bends the vibrator in its thickness direction. This piezoelectric actuator device is employed in a variety of applications, such as a mechanical switch device, a variable capacitance element, a photon scanning device (e.g. barcode reader), and a tuning-fork device used in an angular velocity sensor.

The conventional actuator device is disclosed, for instance, in Patent Literature 1.

CITATION LIST

Patent Literature

Patent Literature 1: Japanese Patent Laid-Open Publication No.

SUMMARY

A piezoelectric actuator device includes a vibrator and a driver configured to vibrate the vibrator. The vibrator includes a lower vibration layer configured to vibrate and an upper vibration layer coupled to an upper surface of the lower vibration layer and configured to vibrate together with the lower vibration layer. The driver includes an upper electrode layer on an upper surface of the lower vibration layer, a piezoelectric layer on an upper surface of the upper electrode layer, and a lower electrode layer on an upper surface of the piezoelectric layer. The lower vibration layer of the vibrator is mainly made of organic material. The upper vibration layer is mainly made of inorganic material. The lower vibration layer has a smaller longitudinal elastic modulus than the upper vibration layer.

The piezoelectric actuator device has a large resistance to disturbance vibrations and a large warping amount of the vibrator without increasing power consumption.

BRIEF DESCRIPTION OF DRAWINGS

FIG. 7B is a sectional view of another piezoelectric actuator device in accordance with Embodiment 2.

DETAIL DESCRIPTION OF PREFERRED EMBODIMENTS

Exemplary Embodiment 1

Figure 1:
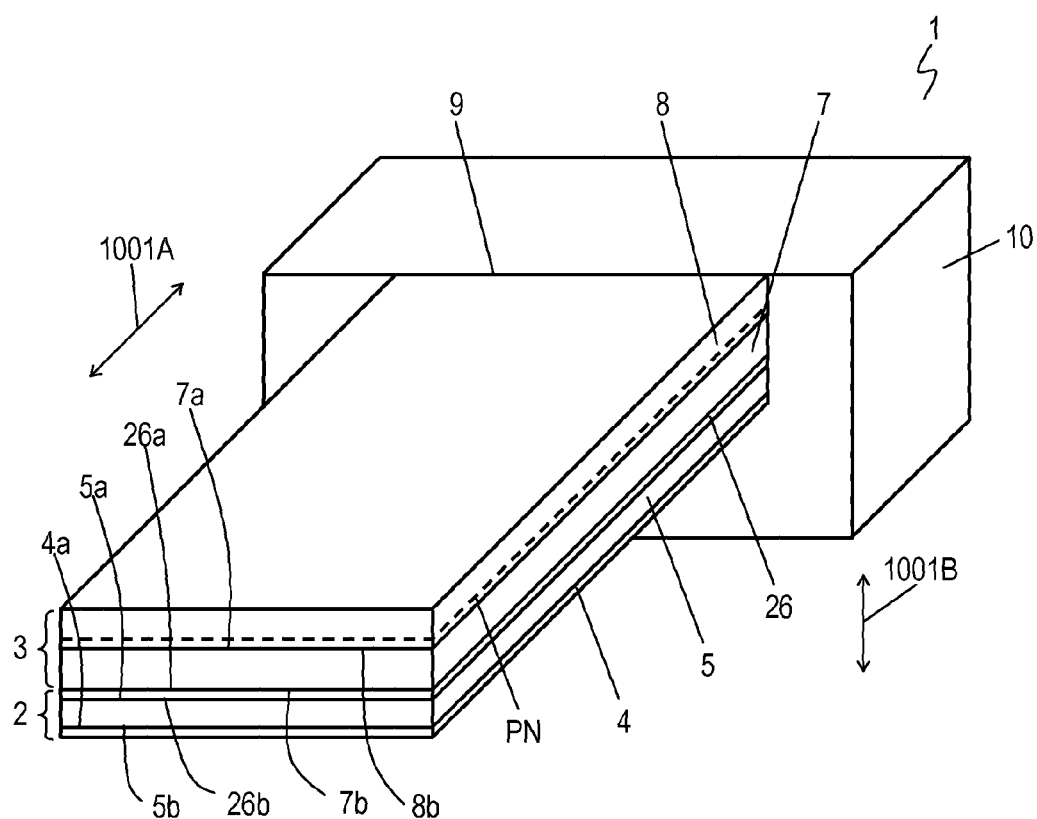
FIG. 1 is a perspective view of a piezoelectric actuator device in accordance with Exemplary Embodiment 1.

FIG. 1 is a perspective view of piezoelectric actuator device 1 in accordance with Exemplary Embodiment 1. Piezoelectric actuator device 1 includes driver 2 and vibrator 3. Driver 2 includes lower electrode layer 4, piezoelectric layer 5 provided on upper surface 4a of lower electrode layer 4, and upper electrode layer 26 provided on upper surface 5a of piezoelectric layer 5. Vibrator 3 includes lower vibration layer 7 contacting upper surface 26a of upper electrode layer 26 and upper vibration layer 8 provided on upper surface 7a of lower vibration layer 7. Upper vibration layer 8 thus directly contacts upper surface 7a of lower vibration layer 7. Piezoelectric actuator device 1 has a rectangular shape extending in longitudinal direction 1001A parallel to the upper surfaces and lower surfaces of the above layers, and has end surface 9 crossing longitudinal direction 1001A is supported by supporter 10 disabling the end surface to move. Lower electrode layer 4, piezoelectric layer 5, upper electrode layer 26, lower electrode layer 7, and upper electrode layer 8 are stacked in thickness direction 1001B perpendicular to the upper surfaces and the lower surfaces of those layers.

Upon having an electric field applied between lower electrode layer 4 and upper electrode layer 26, piezoelectric layer 5 expands and shrinks due to an inverse piezoelectric effect in a surface direction parallel to upper surface 5a and lower surface 5b of piezoelectric layer 5. At this moment, a force generated by the expanding and shrinking of piezoelectric layer 5 acts as a moment acting on piezoelectric actuator device 1 in thickness direction 1001B, so that vibrator 3 may warp in thickness direction 1001B. Vibrator 3 has neutral plane PN parallel to upper surface 7a and lower surfaces 7b and 8b. Neutral plane PN has a length in a longitudinal direction does not change even when vibrator 3 warps.

Decreasing the stiffness of the vibrator is effective to increase the warping amount of the vibrator of the conventional piezoelectric actuator device. However, this arrangement decreases a natural frequency of the piezoelectric actuator, and causes the actuator device to be affected by disturbance vibrations, hence preventing the actuator device from functioning properly. In other words, resistances to disturbance vibrations and the warping amount are in a trade-off relation, so that it is difficult to improve simultaneously both of the resistance and the large amount. In order to improve simultaneously both of the resistance to the disturbance vibrations and the warping amount, the piezoelectric substance has a large thickness to have a large stiffness. This configuration requires a high voltage applied between the lower electrode layer and the upper electrode layer, accordingly increasing power consumption. The piezoelectric substance can be hardly processed finely, so that the device may have a large size.

In piezoelectric actuator device 1 in accordance with Embodiment 1 shown in FIG. 1, lower vibration layer 7 has a smaller modulus of longitudinal elastic modulus than upper vibration layer 8, so that a distance from neutral plane PN to piezoelectric layer 5 in thickness direction 1001B can be increased. As a result, the power generated by piezoelectric layer 5 can be efficiently changed into bending. Piezoelectric actuator device 1 thus can bend vibrator 3 in a greater amount, and yet, the stiffness of vibrator 3 can be also increased. The resistance properties to the disturbance vibrations and the bending amount can be thus simultaneously improved.

Figure 2:
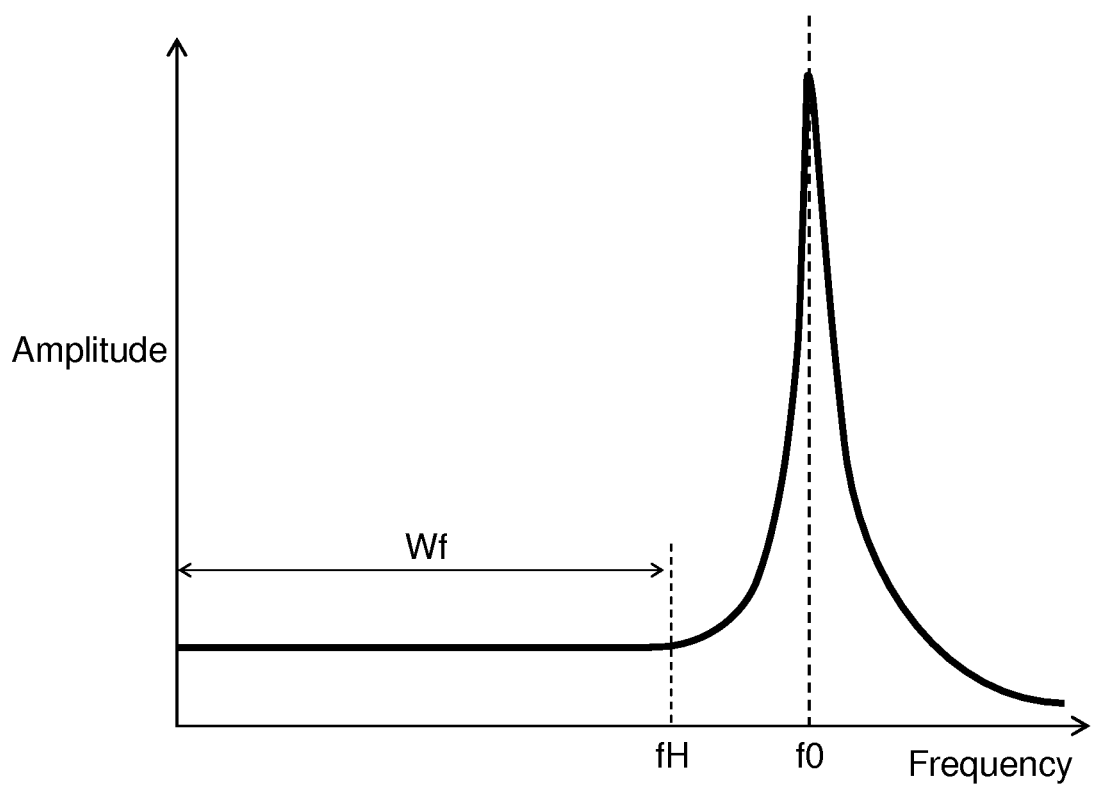
FIG. 2 shows a relation between a frequency and amplitude of the piezoelectric actuator device in accordance with Embodiment 1.

FIG. 2 shows a relation between a frequency of the electric field applied between electrode layers 4 and 26 and an amplitude of piezoelectric actuator device 1 in accordance with Embodiment 1. In FIG. 2, the horizontal axis represents frequency and the vertical axis represents amplitude. When the frequency of the electric field to be applied is equal to natural frequency f0 of piezoelectric actuator device 1, the warping amount increases remarkably; however, this operation makes a driving waveform a sinusoidal wave, restricting a usable range. To be more specific, this operation cannot drive vibrator 3 with an arbitrary waveform or arbitrary timing, so that use of piezoelectric actuator device 1 is limited only to some applications. As shown in FIG. 2, the raising of natural frequency f0 and the falling of the frequency of the electric field within range Wf having a highest frequency not higher than natural frequency f0 can drive vibrator 3 with an arbitrary waveform. The above configuration increases the warping amount of piezoelectric actuator device 1 within the range Wf while natural frequency f0 is kept high. Vibrator 3 can be driven with an arbitrary waveform at arbitrary timing, so that piezoelectric actuator device 1 can be used to various applications.

According to Embodiment 1, lower vibration layer 7 is made of certain organic material, such as epoxy resin, having a longitudinal elastic modulus ranging from, e.g. 1 to 10 GPa while upper vibration layer 8 is made of certain inorganic material, such as copper, having a longitudinal elastic modulus ranging from, e.g. 100 to 150 GPa. This configuration increases a distance from neutral plane PN to piezoelectric layer 5, and increases the warping amount drastically while the resistance to the disturbance vibrations is kept.

Lower vibration layer 7 may further contain inorganic filler mixed with the above organic material. The inorganic filler is made of, for instance, inorganic material, such as aluminum nitride, having a longitudinal elastic modulus ranging from 300 to 350 GPa. The volume ratio of the volume of the organic material to the volume of vibration layer 7 is not smaller than 50%. Vibration layer 7 has a longitudinal elastic modulus ranges from 10 to 50 GPa. In this case, material properties of lower vibration layer 7, such as the longitudinal elastic modulus, can be controlled to have desirable values. This can increases a degree of freedom in designing the piezoelectric actuator device. The inorganic filler may be made of composite material, such as aluminum nitride added with another inorganic material, for instance, silicon oxide. In this case, the volume ratio of the organic material is larger greater than the volume ratio of each of the inorganic materials, and vibration layer 7 is mainly made of the organic material. In this case, a similar effect can be expected to the case that a composite material containing a single substance of aluminum nitride and the organic material is used. In the case that a composite material made of inorganic materials is used, the volume ratio of the organic material is set to not smaller than ⅓, thereby providing a similar effect. When heat generated during driving the vibrator causes a problem, the inorganic material facilitating heat dissipation of lower vibration layer 7, which has the least heat dissipation properties among other structural elements of piezoelectric actuator device 1.

According to Embodiment 1, upper vibration layer 8 is made of inorganic material and a composite material that is formed by decomposing an organic group with raw material, such as organopoly-siloxane. Upper vibration layer 8 is made of a composite material containing 50% or more of inorganic material in volume. The longitudinal elastic modulus of this composite material ranges from 50 to 100 GPa. In this case, lower vibration layer 7 adheres securely to upper vibration layer 8, so that the reliability of piezoelectric actuator device 1 can be increased. This composite material can further contain another organic material, such as epoxy or polyester. In this case, the volume ratio of the inorganic material is higher than the volume ratio of each of the organic materials while vibration layer 8 is mainly made of the inorganic material. This structure can produce a similar effect to the composite material made of the single substance of the organopoly-siloxane. In the case that vibration layer 8 is made of a composite material containing organic materials, the volume ratio of the inorganic material is not smaller than ⅓ for obtaining a similar effect.

As discussed above, lower vibration layer 7 is made of one or more inorganic materials and one or more organic materials including the certain organic material. The total of volume ratios of volumes of the one or more organic materials to lower vibration layer 7 is not smaller than ⅓, and is preferably larger than each of volume ratios of volumes of the one or more inorganic materials to the volume of lower vibration layer 7. It is more preferable that the total of the volume ratios of the one or more organic materials of lower vibration layer 7 exceeds 50%.

Upper vibration layer 8 is made of one or more inorganic materials and one or more organic materials. The total of volume ratios of volumes of the one or more inorganic materials to the volume of upper vibration layer 8 is not smaller than ⅓, and is preferably larger than each of volume ratios of volumes the one or more organic materials to the volume of upper vibration layer 8. It is more preferable that that the total of the volume ratios of the one or organic materials of upper vibration layer 8 exceeds 50%.

A method for manufacturing the piezoelectric actuator device 1 will be described below. FIGS. 3A to 3G are sectional views of piezoelectric actuator device 1 for illustrating the method for manufacturing piezoelectric actuator device 1.

Figure 3A:
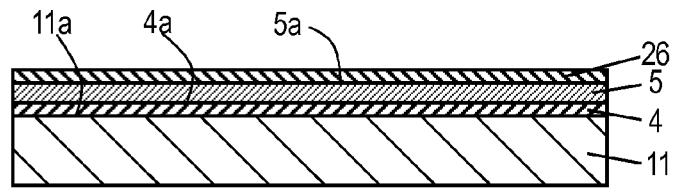
FIG. 3A is a sectional view of the piezoelectric actuator device in accordance with Embodiment 1 for illustrating a method for manufacturing the piezoelectric actuator device.

First, as shown in FIG. 3A, lower electrode layer 4 made of platinum is formed on upper surface 11a of substrate 11 functioning as supporter 10. Then, piezoelectric layer 5 made of lead-zirconate-titante is formed on upper surface 4a of lower electrode layer 4. Then, upper electrode layer 26 is formed on upper surface 5a of piezoelectric layer 5 by a sputtering method. Substrate 11 is made of silicon.

Figure 3B:
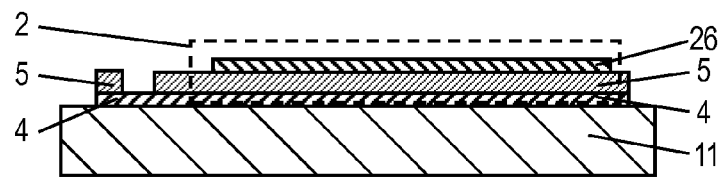
FIG. 3B is a sectional view of the piezoelectric actuator device in accordance with Embodiment 1 for illustrating the method for manufacturing the piezoelectric actuator device.

Next, portions of lower electrode layer 4, piezoelectric layer 5, and upper electrode layer 26 are removed by an ICP dry-etching method with use, as an etching mask, an elastic resin layer having photo-sensitivity, thereby forming driver 2, as shown in FIG. 3B.

Figure 3C:
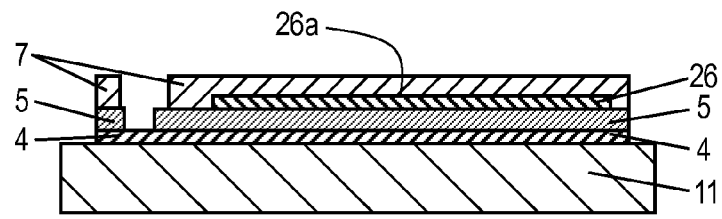
FIG. 3C is a sectional view of the piezoelectric actuator device in accordance with Embodiment 1 for illustrating the method for manufacturing the piezoelectric actuator device.

As shown in FIG. 3C, an elastic resin layer which has photo-sensitivity and promotes a photo-crosslinking reaction is used to form lower vibration layer 7 on upper surface 26a of upper electrode layer 26 of driver 2.

Figure 3D:
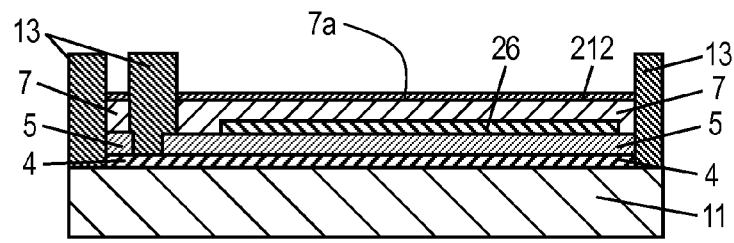
FIG. 3D is a sectional view of the piezoelectric actuator device in accordance with Embodiment 1 for illustrating the method for manufacturing the piezoelectric actuator device.
Figure 3E:
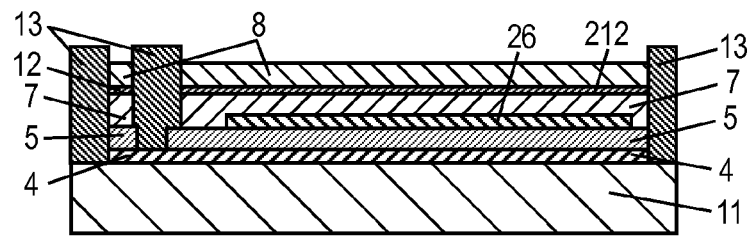
FIG. 3E is a sectional view of the piezoelectric actuator device in accordance with Embodiment 1 for illustrating the method for manufacturing the piezoelectric actuator device.
Figure 3F:
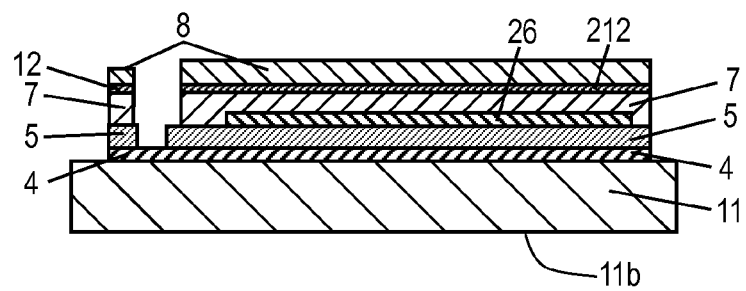
FIG. 3F is a sectional view of the piezoelectric actuator device in accordance with Embodiment 1 for illustrating the method for manufacturing the piezoelectric actuator device.

Next, as shown in FIG. 3D, electrode layer 212 for plating made of copper is formed on upper surface 7a of lower vibration layer 7, and then, cover layer 13 for plating is formed at a position where plating electrode layer 212 is not formed. As shown in FIG. 3E, upper vibration layer 8 made of copper is formed by a plating method on upper surface 7a of lower vibration layer 7. Then, as shown in FIG. 3F, the plating cover layer 13 is removed. Since electrode layer 212 for plating is so thin that upper vibration layer 8 is substantially bonded onto lower vibration layer 7.

Figure 3G:
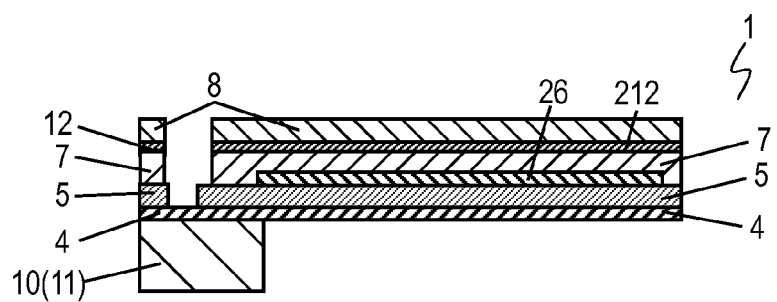
FIG. 3G is a sectional view of the piezoelectric actuator device in accordance with Embodiment 1 for illustrating the method for manufacturing the piezoelectric actuator device.

Finally, as shown in FIG. 3G, a portion of substrate 11 is removed by ICP dry-etching substrate 11 from lower surface 11b of substrate 11 with use of photosensitive elastic-resin layer as an etching mask to allow supporter 10 to remain, thereby providing piezoelectric actuator device 1.

As discussed above, lower vibration layer 7 is formed with use of the photosensitive elastic-resin layer facilitating the promoting photo-cross linking reaction, and upper vibration layer 8 is formed by an electric-field plating method, using the plating cover layer. This method can perform micro-processing easily, and provides piezoelectric actuator device 1 with a small size.

Figure 4:
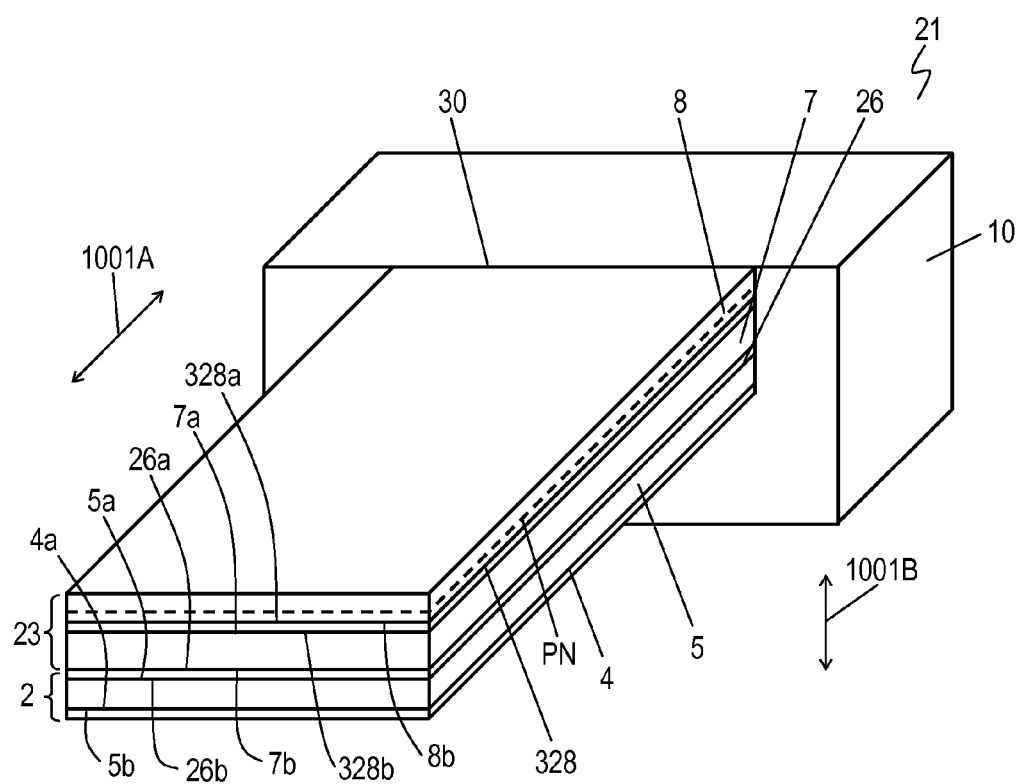
FIG. 4 is a perspective view of another piezoelectric actuator device in accordance with Embodiment 1.

FIG. 4 is a perspective view of another piezoelectric actuator device 21 in accordance with Embodiment 1. In FIG. 4, components identical to those of piezoelectric actuator device 21 shown in FIG. 1 are denoted by the same reference numerals. Piezoelectric actuator device 21 includes driver 2 and vibrator 23. Driver 2 includes lower electrode layer 4, piezoelectric layer 5 provided on upper surface 4a of lower electrode layer 4, and upper electrode layer 26 provided on upper surface 5a of piezoelectric layer 5. Vibrator 23 includes lower vibration layer 7 contacting upper surface 26a of upper electrode layer 26, middle electrode layer 328 provided on upper surface 7a of lower vibration layer 7, and upper vibration layer 8 provided on upper surface 328a of middle electrode layer 328. Upper vibration layer 8 is thus coupled to upper surface 7a of lower vibration layer 7 via middle electrode layer 328. Middle electrode layer 328 is joined to upper surface 7a of lower vibration layer 7 and lower surface 8b of upper vibration layer 8. Piezoelectric actuator device 21 has a rectangular shape extending in longitudinal direction 1001A perpendicular to the upper surfaces and lower surfaces of the above layers. Piezoelectric actuator device 21 has an end surface crossing longitudinal direction 1001A is rigidly fixed to supporter 10. Lower electrode layer 4, piezoelectric layer 5, upper electrode layer 26, lower vibration layer 7, middle electrode layer 328, and upper vibration layer 8 are stacked in thickness direction 1001B perpendicular to the upper surfaces and lower surfaces of these layers.

Upon having an electric field applied between lower electrode layer 4 and upper electrode layer 26, piezoelectric layer 5 expands and shrinks in a surface direction parallel to upper surface 5a and lower surface 5b due to an inverse piezoelectric effect. A force generated by the expanding and shrinking of piezoelectric layer 5 acts as a moment in thickness direction 1001B of actuator device 21, thereby causing vibrator 23 to warp in thickness direction 1001B. A longitudinal elastic modulus of lower vibration layer 7 is smaller than that of upper vibration layer 8. This configuration increases a distance from neutral plane PN of the warping to piezoelectric layer 5, so that the force generated by piezoelectric layer 5 can be converted into the warping efficiently. The structure provides a large warping amount and increases the stiffness of vibrator 23, hence increasing the resistance to disturbance vibrations and the warping amount simultaneously.

In piezoelectric actuator device 21 shown in FIG. 4, lower vibration layer 7 is made of piezoelectric polymeric material. Upon having the electric field applied between upper electrode layer 26 and middle electrode layer 328, lower vibration layer 7 expands and shrinks in the surface direction. At this moment, an electric field is applied to lower vibration layer 7 so as to expand and shrink in the same direction as piezoelectric layer 5, and then, lower vibration layer 7 expands and shrinks in the surface direction similarly to the electric field applied to piezoelectric layer 5. To be more specific, a voltage is applied between upper electrode layer 26 and middle electrode layer 328. A force generated by the expanding and shrinking of lower vibration layer 7 acts as a moment in the thickness direction of piezoelectric actuator device 21, so that vibrator 23 can warp in thickness direction 1001B. Lower vibration layer 7 thus functions as vibrator 23 while functioning as the driver. Lower vibration layer 7 made of the piezoelectric polymeric material provides a large warping amount without decreasing of the stiffness of vibrator 23. Middle electrode layer 328 is extremely thinner than lower vibration layer 7 and upper vibration layer 8, so that middle electrode layer 328 may not substantially influence the vibrations of vibrator 23. The longitudinal elastic modulus of middle electrode layer 328 is equal to that of each of lower vibration layer 7 and upper vibration layer 8. This configuration can eliminate the influence of middle electrode layer 328 to the vibrations of vibrator 23. Electrode layer 212 used for plating shown in FIGS. 3A to 3G can be used as middle electrode layer 328.

In piezoelectric actuator device 1 shown in FIG. 1, upper vibration layer 8 made of conductive material allows vibration layer 8 to act as middle electrode 328 shown in FIG. 4. In other words, in piezoelectric actuator device 1, a voltage can be applied between upper electrode layer 26 and upper vibration layer 8 which is made of conductive material. At this moment, upon having an electric field applied to lower vibration layer 7 in order for lower vibration layer 7 to expand and shrink in the same direction as piezoelectric layer 5, lower vibration layer 7 functions as the driver while functioning as vibrator 3 similarly to piezoelectric actuator device 21 that includes middle electrode layer 328. This structure provides a large warping amount without decreasing the stiffness of vibrator 3, and allows manufacturing processes to be simpler than those of the device including middle electrode layer 328.

Lower vibration layer 7 of piezoelectric actuator device 1 is made of piezoelectric polymeric material, such as poly-vinylidene fluoride having a longitudinal elastic modulus ranging from 1 to 20 GPa, and upper vibration layer 8 is made of inorganic material, such as copper, having a longitudinal elastic modulus ranging from 100 to 150 GPa. This structure increases a distance from neutral plane PN of the warping to the piezoelectric layer. Lower vibration layer 7 functions as a driver in addition to driver 2, and hence increases the warping amount drastically while maintaining the resistance to disturbance vibrations.

Piezoelectric layer 5 and lower vibration layer 7 made of piezoelectric polymeric material may be configured such that piezoelectric layer 5 and lower vibration layer 7 are polarized in directions opposite to each other along thickness direction 1001B in response to the electric field. Upper electrode layer 8 and lower electrode layer 4 made of conductive materials are configured such that upper electrode layer 8 and lower electrode layer 4 have the same electric potential. Upon having an electric field applied between lower electrode layer 4 and upper electrode layer 26 as well as between upper vibration layer 8 and upper electrode layer 26, piezoelectric layer 5 and lower vibration layer 7 warp in the same direction since lower vibration layer 7 and piezoelectric layer 5 are polarized in the directions opposite to each other. Lower electrode layer 4 is connected to upper vibration layer 8 to provide lower electrode layer 4 and upper vibration layer 8 with the same electric potential, so that these layers can be connected to the same power supply, hence providing the actuator device with a small size and simplifying its manufacturing processes.

Exemplary Embodiment 2

Figure 5:
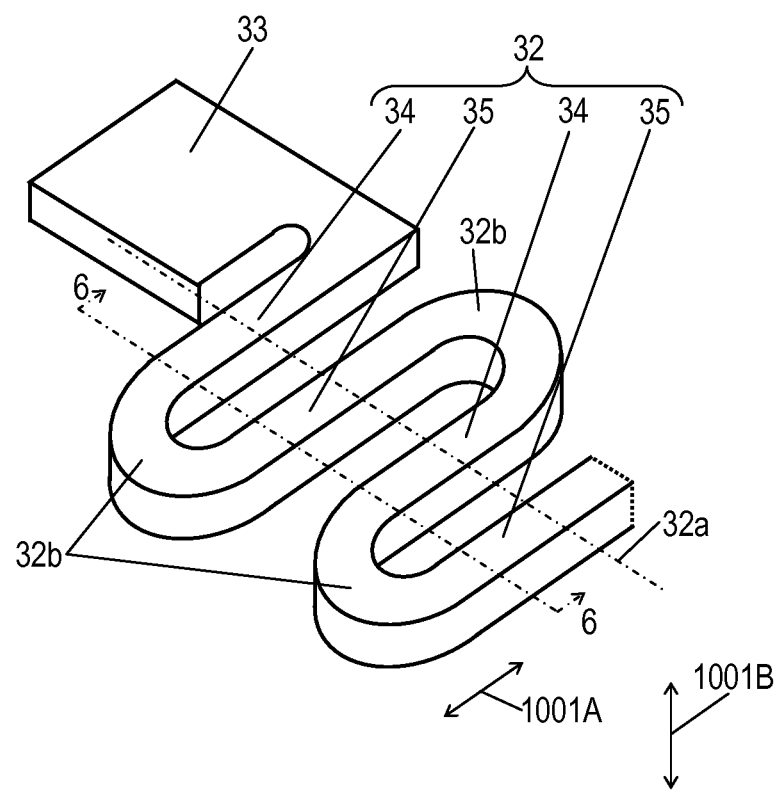
FIG. 5 is a perspective view of a piezoelectric actuator device in accordance with Exemplary Embodiment 2.

FIG. 5 is a perspective view of piezoelectric actuator device 32 in accordance with Exemplary Embodiment 2. In FIG. 5, components identical to those of piezoelectric actuator devices 1 and 21 in accordance with Embodiment 1 shown in FIGS. 1 to 4 are denoted by the same reference numerals. Piezoelectric actuator device 32 is an oscillator having a meandrous shape extending meanderingly along vibration axis 32a. Piezoelectric actuator device 32 includes piezoelectric actuators 34 and 35 extending slenderly in longitudinal direction 1001A perpendicular to vibration axis 32a. Piezoelectric actuators 34 and piezoelectric actuators 35 are alternately disposed along vibration axis 32a and connected to each other at fold-back portions 32b. Piezoelectric actuator device 32 is connected to supporter 33.

Figure 6:
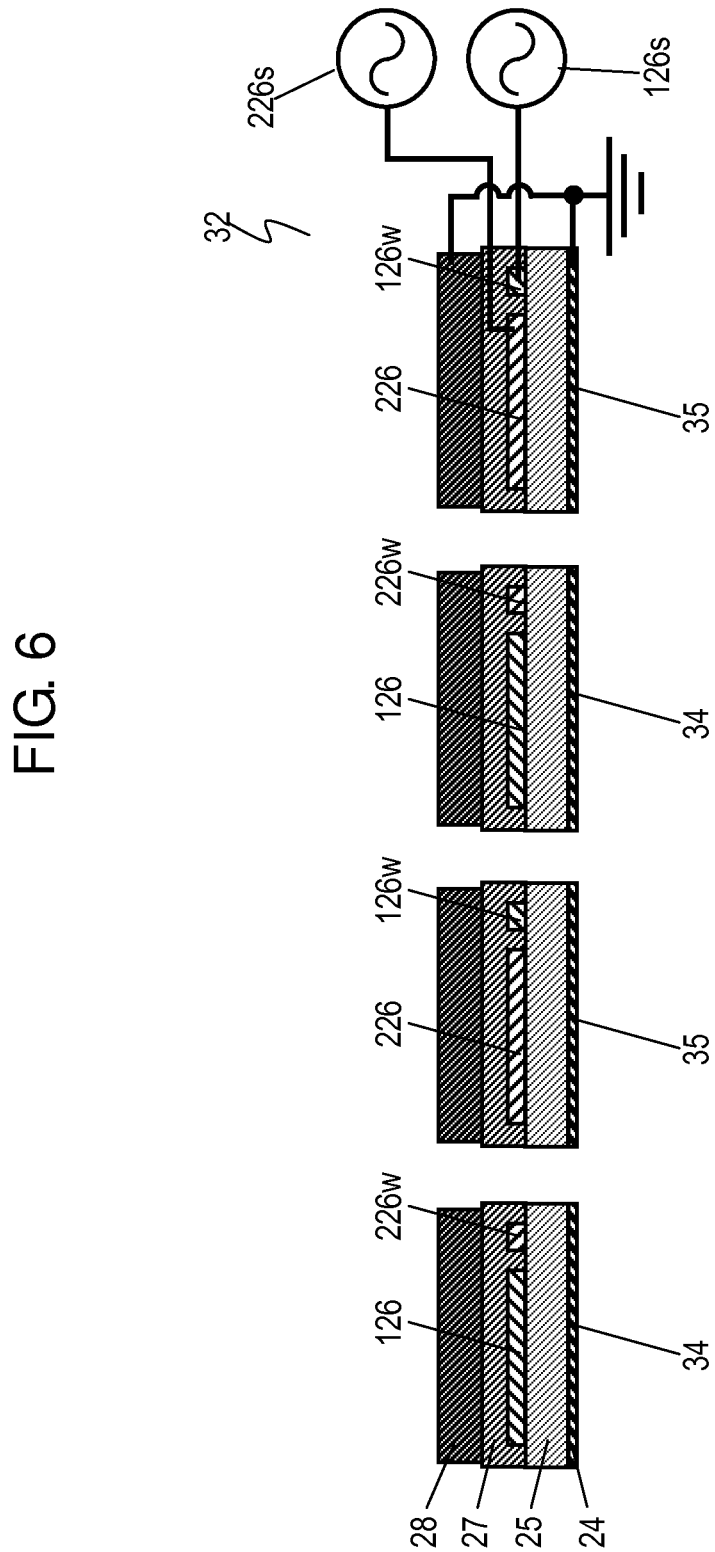
FIG. 6 is a sectional view of the piezoelectric actuator device at line 6-6 shown in FIG. 5.

FIG. 6 is a sectional view of piezoelectric actuator device 32 at line 6-6 shown in FIG. 5. Piezoelectric actuator 34 includes lower electrode layer 24, piezoelectric layer 25, upper electrode layer 126, lower vibration layer 27, and upper vibration layer 28. These structural elements are made of materials of those of piezoelectric layer 5, upper electrode layer 26, lower vibration layer 7, and upper vibration layer 8 of piezoelectric actuator device 1 shown in FIG. 1 in accordance with Embodiment 1. These elements are stacked in the same order as the elements of device 1 in thickness direction 1001B. Piezoelectric actuator 35 includes lower electrode layer 24, piezoelectric layer 25, upper electrode layer 226, lower vibration layer 27, and upper vibration layer 28. These structural elements are made of materials respectively to those for piezoelectric layer 5, upper electrode layer 26, lower vibration layer 7, and upper vibration layer 8 of piezoelectric actuator device 1 shown in FIG. 1. These elements are disposed similarly to the foregoing elements of device 1. When piezoelectric actuators 34 and 35 are driven by driving waveforms different from each other, upper vibration layers 28 preferably have the same electric potential as their lower electrode layers 24. In piezoelectric actuator device 32 in accordance with Embodiment 2, lower electrode layers 24 are connected to each other while upper vibration layers 28 are connected to each other. Upper electrode layers 126 of piezoelectric actuators 34 are not connected to upper electrode layers 226 of piezoelectric actuators 35. Upper electrode layers 126 of piezoelectric actuators 34 are connected to each other via wirings 126w. Wirings 126w are provided between upper surface 25a of piezoelectric layer 25 of actuator 35 and lower surfaces 27b of lower vibration layer 27 and extend along piezoelectric actuators 35 and fold-back portions 32b. Similarly, upper electrode layers 226 of actuators 25 are connected together via wirings 226w. Wirings 226w are provided between upper surface 25a of piezoelectric layer 25 of actuator 35 and lower surfaces 27b of lower vibration layer 27 and extend along piezoelectric actuators 34 and fold-back portions 32b. Alternating-current (AC) power supply 126s applies an AC voltage, via wirings 126w of actuator 34, between lower electrode layers 24 and upper electrode layers 126 as well as between upper vibration layers 28 and upper electrode layers 126. AC power supply 226s applies an AC voltage, via wirings 226w of actuator 35, between lower electrode layers 24 and upper electrode layers 226 as well as between upper vibration layers 28 and upper electrode layers 226. AC power supply 126s applies the AC voltage to upper electrode layer 126 having a phase reverse to that of the AC voltage applied to upper electrode layer 226 by AC power supply 226s. In piezoelectric actuator 34, since piezoelectric layer 25 and lower vibration layer 27 are polarized in directions opposite to each other in response to the electric field, the AC voltages applied between lower electrode layer 24 and upper electrode layer 126 as well as between upper vibration layer 28 and upper electrode layer 126 cause both of piezoelectric layer 25 and lower vibration layer 27 to warp in the same direction along thickness direction 1001B. Similarly, since piezoelectric layer 25 and lower vibration layer 27 in piezoelectric actuator 35 are polarized in directions opposite to each other in response to the electric field, the AC voltages applied between lower electrode layer 24 and upper electrode layer 226 as well as between upper vibration layer 28 and upper electrode layer 226 cause both of piezoelectric layer 25 and lower vibration layer 27 to warp in the same direction along thickness direction 1001B.

Figure 7A:
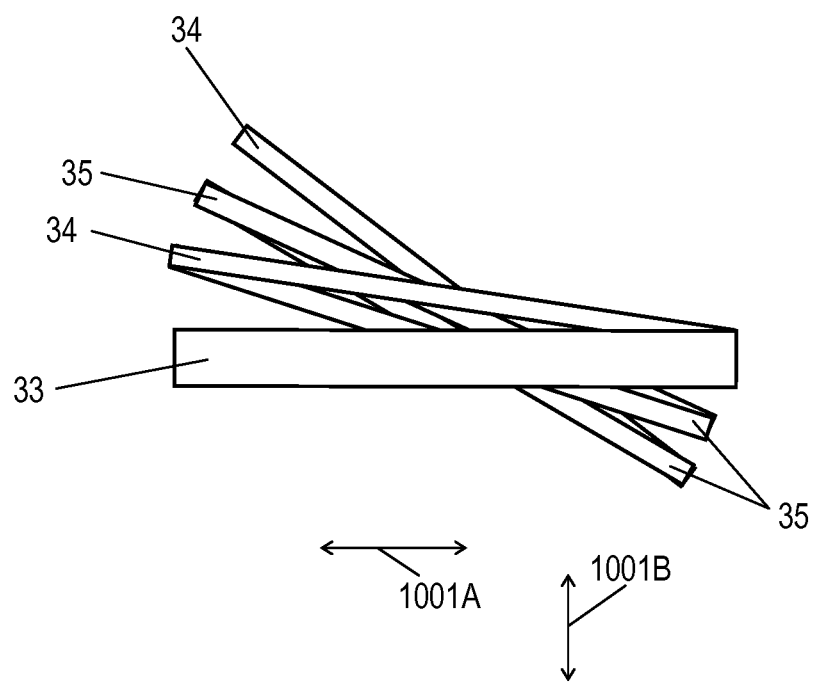
FIG. 7A is a side view of the piezoelectric actuator device in accordance with Embodiment 2 for illustrating an operation of the device.

FIG. 7A is a side view of piezoelectric actuator device 32 for illustrating an operation of piezoelectric actuator device 32. The AC voltages supplied from AC power supplies 126s and 226s allows the warping amounts of actuators 34 and 35 along thickness direction 1001B to be summed, so that piezoelectric actuator device 32 can be driven with a larger displacement than a device with a single actuator. Upper vibration layers 28 of actuators 34 and 35 with electrical potentials identical to each other thus simplify the structure of the electrode. As discussed above, although piezoelectric actuator device 32 performing a complex operation in which at least two actuators out of the actuators are driven with the voltages having phases opposite to each other, device 32 can obtain a large warping amount without complicating the structure of the electrode.

Upper vibration layers 28 of piezoelectric actuators 34 and 35 are made of conductive material. As shown in FIG. 6, upper vibration layers 28 and lower electrode layers 24 of actuators 34 and 35 are connected together, and reduce the number of electrodes, hence further simplifying the structure of the electrode.

Piezoelectric actuators 34 and 35 of piezoelectric actuator device 32 according to Embodiment 2 have the meandrous shapes; however, they are not limited to this shape. As long as piezoelectric actuator device 32 includes at least two actuators 34 and 35 driven by AC power sources having phases opposite to each other, the actuators can have any shape other than the meandrous shape and provide the same effects.

FIG. 7B is a sectional view of another piezoelectric actuator device 132 in accordance Embodiment 2. In FIG. 7B, components identical to those of piezoelectric actuator device 32 shown in FIG. 6 are denoted by the same reference numerals. In piezoelectric actuator device 132 shown in FIG. 7B, actuators 34 and 35 further include middle electrode layers 428 disposed between upper surface 27a of lower vibration layer 27 and lower surface 28b of upper vibration layer 28. This structure is the same as piezoelectric actuator device 21 shown in FIG. 4. In piezoelectric actuator device 132, middle electrode layer 428, instead of upper vibration layer 28 of device 32 shown in FIG. 6, is connected to lower electrode layer 24. Voltages are applied from AC power supplies 126s and 226s, so that piezoelectric actuator device 132 produces a similar advantage to that of piezoelectric actuator device 32 shown in FIG. 6.

Exemplary Embodiment 3

Figure 8A:
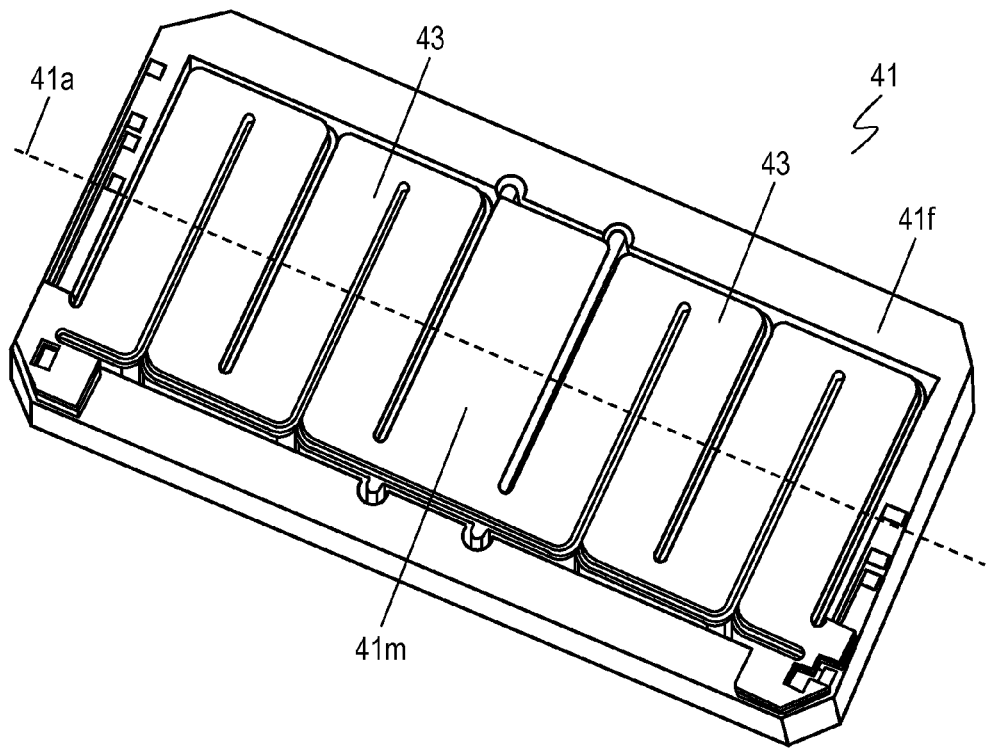
FIG. 8A is a perspective view of a piezoelectric actuator device in accordance with Exemplary Embodiment 3.

FIG. 8A is a perspective view of piezoelectric actuator device 41 in accordance with Exemplary Embodiment 3. Piezoelectric actuator device 41 is an optical reflecting device, and includes frame 41f, a pair of vibrators 43 supported by frame 41f, and mirror 41m supported by the pair of vibrators 43. Outer edges of the pair of vibrators 43 are connected to inner edges of two sides of frame 41f opposite to each other. Vibrators 43 have meandrous shapes. Frame 41f thus supports respective one ends of the pair of vibrators 43, and mirror 41m is supported by respective another ends of the pair of vibrators 43. Frame 41f may support one end of a vibrator of vibrators 43. In this case, mirror 41m is supported by another end of the vibrator of vibrators 43.

Vibrator 43 extends meanderingly along vibration axis 41a extending substantially through the center of mirror 41m. The pair of vibrators 43 are symmetrical to each other with respect to the normal line of vibration axis 41a extending through the center of mirror 41m.

Figure 8B:
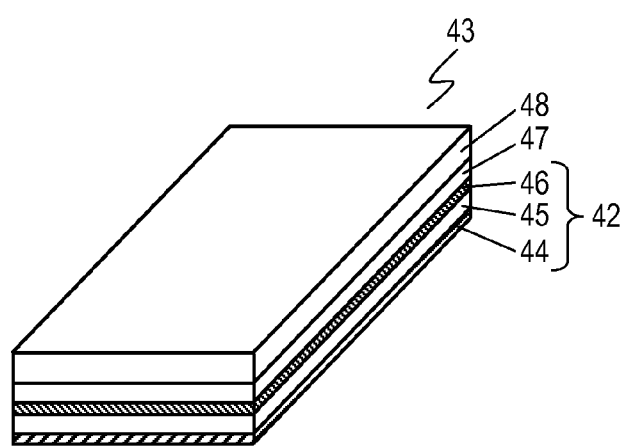
FIG. 8B is an enlarged perspective view of the piezoelectric actuator device shown in FIG. 8A.

FIG. 8B is an enlarged perspective view of vibrator 43 of piezoelectric actuator device 41. Vibrator 43 has a structure similar to that of piezoelectric actuator device 32 shown in FIGS. 5 and 6 in accordance with Embodiment 2. Vibrator 43 includes lower vibration layer 47 and upper vibration layer 48 that are made of the same materials as those of lower vibration layer 27 and upper vibration layer 28 of piezoelectric actuator device 32, and are stacked together similarly to piezoelectric actuator device 32. Lower vibration layer 47 and upper vibration layer 48 have meandrous shapes. Vibrator 43 further includes lower electrode layer 44, piezoelectric layer 45, and upper electrode layer 46. Lower electrode layer 44, piezoelectric layer 45, and upper electrode layer 46 layers are made of the same materials as lower electrode layer 24, piezoelectric layer 25, and upper electrode layer 126 (226) of piezoelectric actuator device 32, respectively.

These layers are stacked together to form driver 42 similarly to piezoelectric device actuator device 32. Voltages are applied between lower electrode layer 44 and upper electrode layer 46 as well as between upper electrode layer 46 and upper vibration layer 48 of vibrator 43. This is a similar structure to piezoelectric actuator device 32 shown in FIG. 6 in accordance with Embodiment 2, namely, the voltages are applied between lower electrode layer 24 and upper electrode layer 126 (226) as well as between upper electrode layer 126 (226) and upper vibration layer 28. These voltages cause vibrator 43 to vibrate to rotate about vibration axis 41a, and cause mirror 41m to vibrate to rotate about vibration axis 41a.

Piezoelectric actuator device 41 has effects similar to piezoelectric actuator device 32 in accordance with Embodiment 2. Piezoelectric actuator device 41 can obtain a large warping amount of vibrator 43 and a large stiffness of vibrator 43. Piezoelectric actuator device 41 thus increases both of the resistance to disturbance vibrations and the amplitude.

In piezoelectric actuator device 41 in accordance with Embodiment 3, vibrator 43 may include a middle electrode layer bonded to the upper surface of lower vibration layer 47 and the lower surface of upper vibration layer 48. This structure provides actuator device 41 with the same effects as piezoelectric actuator device 132.

Exemplary Embodiment 4

Figure 9A:
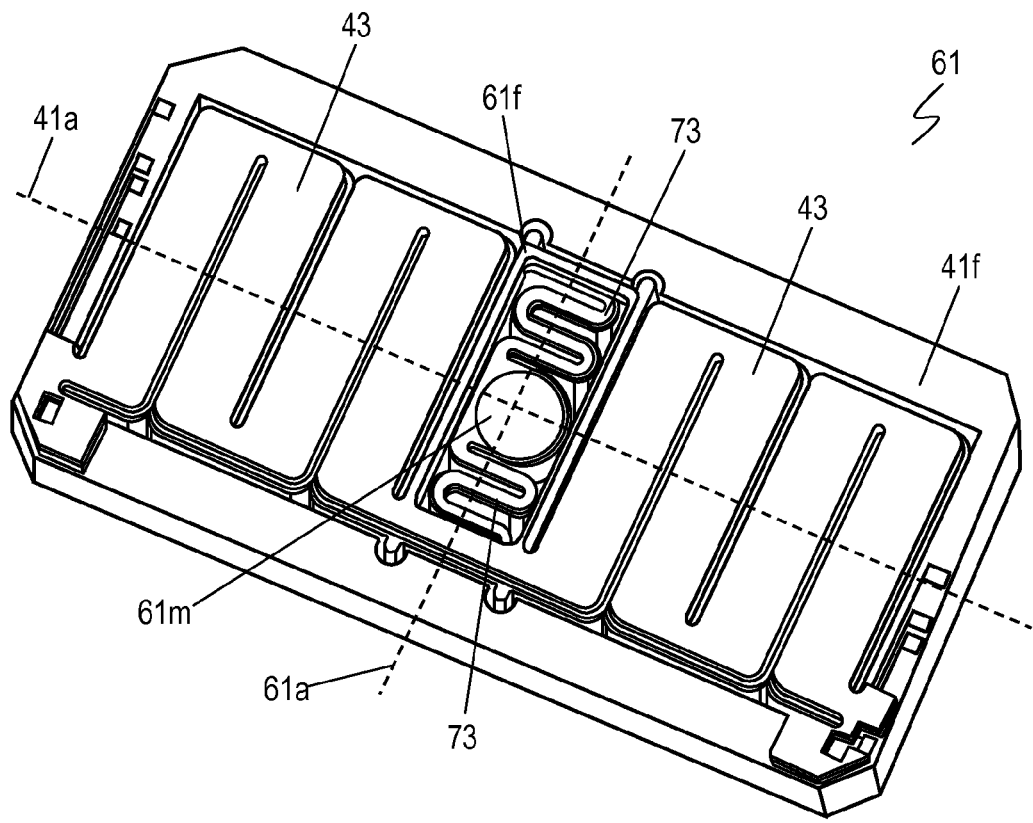
FIG. 9A is a perspective view of a piezoelectric actuator device in accordance with Exemplary Embodiment 4.

FIG. 9A is a perspective view of piezoelectric actuator device 61 in accordance with Exemplary Embodiment 4. In FIG. 9A, components identical to those of piezoelectric actuator device 41 shown in FIG. 8A in accordance with Embodiment 3 are denoted by the same reference numerals. Piezoelectric actuator device 61 is an optical reflecting device, and includes frame 41f, a pair of vibrators 43 supported by frame 41f, frame 61f supported by the pair of vibrators 43, a pair of vibrators 73 supported by frame 61f, and mirror 61m supported by respective inner ends of vibrators 73. Vibrators 43 and 73 have meandrous shapes extending along vibration axes 41a and 61a crossing perpendicularly to each other, respectively. Respective one ends of the pair of vibrators 43 are connected insides of respective ones of two opposite sides of frame 41f to be supported. Frame 61f is supported by respective another ends of the pair of vibrators 43. Respective one ends of vibrators 73 are connected respective ones of insides of two opposite sides of frame 61f on vibration axis 61a to be supported.

Vibration axes 41a and 61a cross each other perpendicularly substantially at a center of mirror 61m. Vibrators 43 are symmetrical to each other with respect to vibration axis 61a. Vibrators 73 are symmetrical to each other with respect to vibration axis 41a.

Figure 9B:
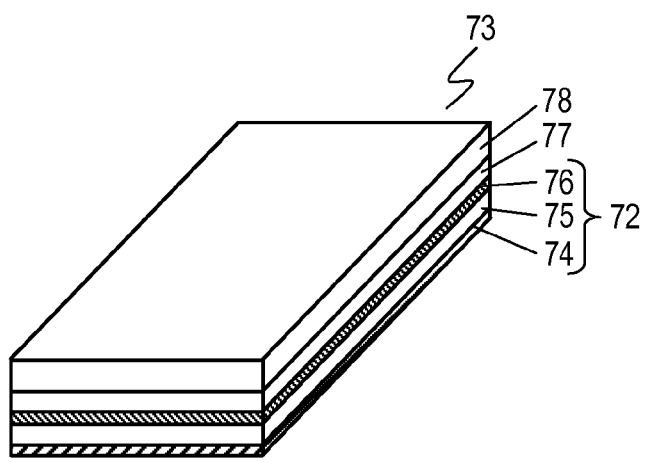
FIG. 9B is an enlarged perspective view of the piezoelectric actuator device shown in FIG. 9A.

FIG. 9B is an enlarged perspective view of vibrator 73 of piezoelectric actuator device 61. Vibrator 73 has a structure similar to that of vibrator 43 shown in FIG. 8B of piezoelectric actuator device 32 shown in FIGS. 5 and 6 in accordance with Embodiment 2. Vibrator 73 includes lower vibration layer 77 and upper vibration layer 78. Lower vibration layer 77 and upper vibration layer 78 are made of the same materials as lower vibration layer 27 and upper vibration layer 28, respectively, and are stacked together similarly to the layers of vibrator 43. Lower vibration layer 77 and upper vibration layer 78 have meandrous shapes. Vibrator 73 further includes lower electrode layer 74, piezoelectric layer 75, and upper electrode layer 76. Lower electrode layer 74, piezoelectric layer 75, and upper electrode layer 76 are made of the same materials as lower electrode layer 24, piezoelectric layer 25, and upper electrode layer 126 (226) of piezoelectric actuator device 32, respectively. Lower electrode layer 74, piezoelectric layer 75, and upper electrode layer 76 are stacked together to form driver 72 in similarly to the layers of piezoelectric actuator device 32. Voltages are applied between lower electrode layer 74 and upper electrode layer 76 as well as between upper electrode layer 76 and upper vibration layer 78 of vibrator 73. This is a similar structure to piezoelectric actuator device 32 shown in FIG. 6 in accordance with Embodiment 2, namely, the voltages are applied between lower electrode layer 24 and upper electrode layer 126 (226) as well as between upper electrode layer 126 (226) and upper vibration layer 28. These voltages cause vibrator 73 to vibrate to rotate about vibration axis 61a, and cause mirror 61m to vibrate to rotate about vibration axis 61a. The vibration and rotation of vibrator 43 about vibration axis 41a cause frame 61f to vibrate to rotate about vibration axis 41a. As a result, mirror 61m rotates about vibration axes 41a and 61a crossing each other perpendicularly.

Piezoelectric actuator device 61 has the same effects as piezoelectric actuator device 41 in accordance with Embodiment 3, so that actuator device 61 provides large warping amounts of vibrators 43 and 73 and large stiffness of these vibrators. Piezoelectric actuator device 61 thus improves both of the resistance to disturbance vibrations and the amplitude produced by the rotation.

Vibrator 73 is made of material having a larger longitudinal elastic modulus than material of vibrator 43. This configuration allow a natural frequency of the rotation of vibrator 43 about vibration axis 41a at a frequency much lower than a natural frequency of the vibration of the rotation about vibration axis 61a without increasing the area of vibrator 43, thus providing piezoelectric actuator device 61 suitable for a display. While a natural frequency of the rotation about vibrations axis 41a is maintained to be high, the amplitude of the rotation at a frequency lower than the natural frequency can be increased. This structure thus allows piezoelectric actuator device 61 to allow frame 61f and mirror 61m to rotate stably with an arbitrary driving waveform, such as a triangular wave or a saw-tooth wave other than the sinusoidal wave. Piezoelectric actuator device 61 can display an image by an ideal raster scanning.

The layers of vibrators 43, 73 and drivers 42, 72 can be used commonly to each other. To be more specific, lower vibration layer 47 and upper vibration layer 48 of vibrator 43 are made of the same layer as lower vibration layer 77 and upper vibration layer 78 of further vibrator 73, respectively. Lower electrode layer 44 and piezoelectric layer 45 of driver 42 are made of the same layers as lower electrode layer 74 and piezoelectric layer 75 of further driver 72. Upper electrode layer 46 of driver 42 is formed similarly to upper electrodes 126, 226 of piezoelectric actuator device 32 shown in FIG. 6 in accordance with Embodiment 2. Upper electrode layer 76 of further driver 72 is also formed similarly to upper electrodes 126 and 226 of piezoelectric actuator device 32 shown in FIG. 6. This construction allows simplifying the structure of piezoelectric actuator device 61.

In piezoelectric actuator device 61 in accordance with Embodiment 4, vibrator 43 may include a middle electrode layer bonded to the upper surface of lower vibration layer 47 and the lower surface of upper vibration layer 48, similarly to piezoelectric actuator 132 shown in FIG. 7B in accordance with Embodiment 2. Further vibrator 73 may include a further middle electrode layer bonded to an upper surface of further lower vibration layer 77 and a lower surface of further upper vibration layer 78. Piezoelectric actuator device 81 has the same effects as piezoelectric actuator device 132.

Exemplary Embodiment 5

Figure 10:
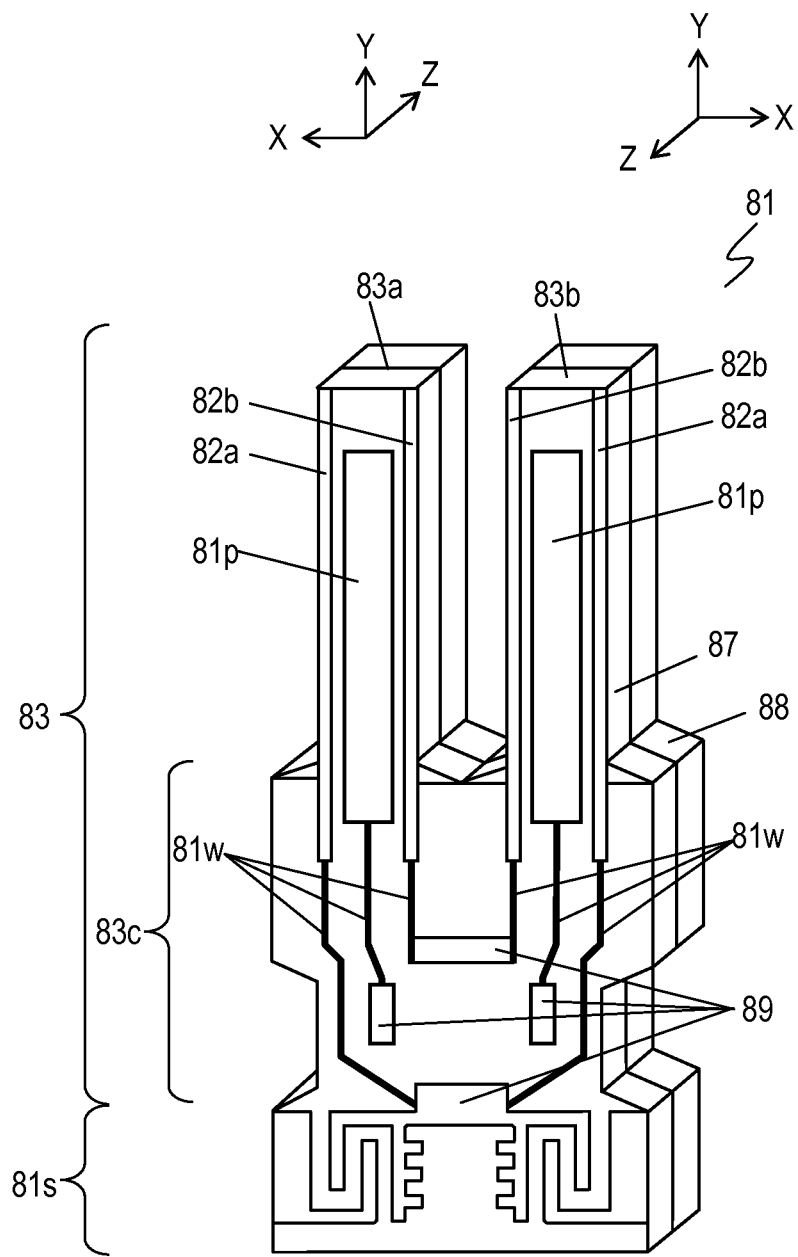
FIG. 10 is a perspective view of a piezoelectric actuator device in accordance with Exemplary Embodiment 5.

FIG. 10 is a perspective view of piezoelectric actuator device 81 in accordance with Exemplary Embodiment 5. Piezoelectric actuator device 81 is a sensor for detecting an angular velocity.

Piezoelectric actuator device 81 includes vibrator 83 and supporter 81s supporting vibrator 83. Vibrator 83 includes lower vibration layer 87 and upper vibration layer 88 made of the same material as lower vibration layer 7 and upper vibration layer 8 of piezoelectric actuator device 1 shown in FIG. 1, respectively. Vibration layers 87 and 88 are stacked together similarly to vibration layers 7 and 8. Vibrator 83 includes arms 83a and 83b and vibration transition part 83c that supports arms 83a and 83b. Arms 83a and 83b extend from vibration transition part 83c in parallel to each other, so that vibrator 83 has a tuning fork shape. While arms 83a and 83b vibrate in an X-axis, a Coriolis force acting on arms 83a and 83b in Z-axis is detected as an angular velocity.

Drivers 82a and 82b and detector 81p placed between drivers 82a and 82b are disposed on one surface of each of arms 83a and 83b. Drivers 82a and 82b and detector 81p are made of the same materials as lower electrode layer 4, piezoelectric layer 5, and upper electrode layer 26 of driver 2 of piezoelectric actuator device 1 shown in FIG. 1 in accordance with Embodiment 1. Similarly to Piezoelectric actuator device 1, driver 83 includes a lower electrode layer, a piezoelectric layer, and an upper electrode layer that are stacked on lower vibration layer 87. The lower and upper electrode layers are connected via wirings 81w to external electrodes 89 disposed at vibration transition part 83c or supporter 81s. Upon having an AC voltage applied to external electrodes 89, the piezoelectric layer and lower vibration layer 87 of drivers 82a and 82b generates cyclical distortions, thereby causing arms 83a and 83b to vibrate.

Drivers 82a and 82b are disposed on peripheries of one surface of arm 83a opposite to each other. Voltages having phases opposite to each other supplied from external electrodes 89 to drivers 82a and 82b cause the piezoelectric layer of driver 82a to expand in a positive direction of a Y-axis, and cause the piezoelectric layer of driver 82b to shrink in an negative direction along the Y-axis. As a result, arm 83a warps in a direction along the X-axis. Drivers 82a and 82b are disposed on peripheries of one surface of arm 83b opposite to each other. Voltages having phases opposite to each other are supplied from external electrodes 89 to drivers 82a and 82b cause the piezoelectric layer of driver 82a to expand in the positive direction along the Y-axis, and cause the piezoelectric layer of driver 82b to shrink in a negative direction along the Y-axis. As a result, arm 83b warps in a direction along the X-axis. These operations are repeated periodically, and the phases of the voltages applied to drivers 82a and 82b are controlled such that arms 83a and 83b warp in directions opposite to each other, thereby causing arms 83a and 83b to repetitively vibrate within a XY plane including the X-axis and the Y-axis.

While arms 83a and 83b vibrate repetitively within the XY-plane, upon having an angular velocity about the Y-axis, arms 83a and 83b warp in directions opposite to each other along Z-axis due to a Coriolis force produced by the angular velocity. Detector 81p detects, as the angular velocity, the warping amount caused by the Coriolis force in the direction along the Z-axis. In other words, the warping of arms 83a and 83b produce electric charges in the piezoelectric layer of detector 81p. The electric charges are taken out from external electrodes 89 via the upper electrode layer and the lower electrode layer to be detected as the angular velocity.

Lower vibration layer 87 has a smaller longitudinal elastic modulus than upper vibration layer 88, so that distances from a neutral plane of the warping to the piezoelectric layers of drivers 82a and 82b can be increased. This configuration allows a force generated in the piezoelectric layers to be efficiently converted to the warping. The structure discussed above allows arms 83*a* and 83*b* to efficiently vibrate repetitively while maintaining the stiffness of vibrator 83. As a result, the voltage applied to drivers 82*a* and 82*b* can be lowered, and the electric charges produced in detector 81*p* can be increased, so that piezoelectric actuator device 81 can increase its sensitivity as a sensor.

Piezoelectric actuator device 81 functions not only as the angular velocity sensor but also as a sensor for sensitively detecting a physical quantity by detecting distortion of vibrator 83 which vibrating.

Exemplary Embodiment 6

Figure 11:
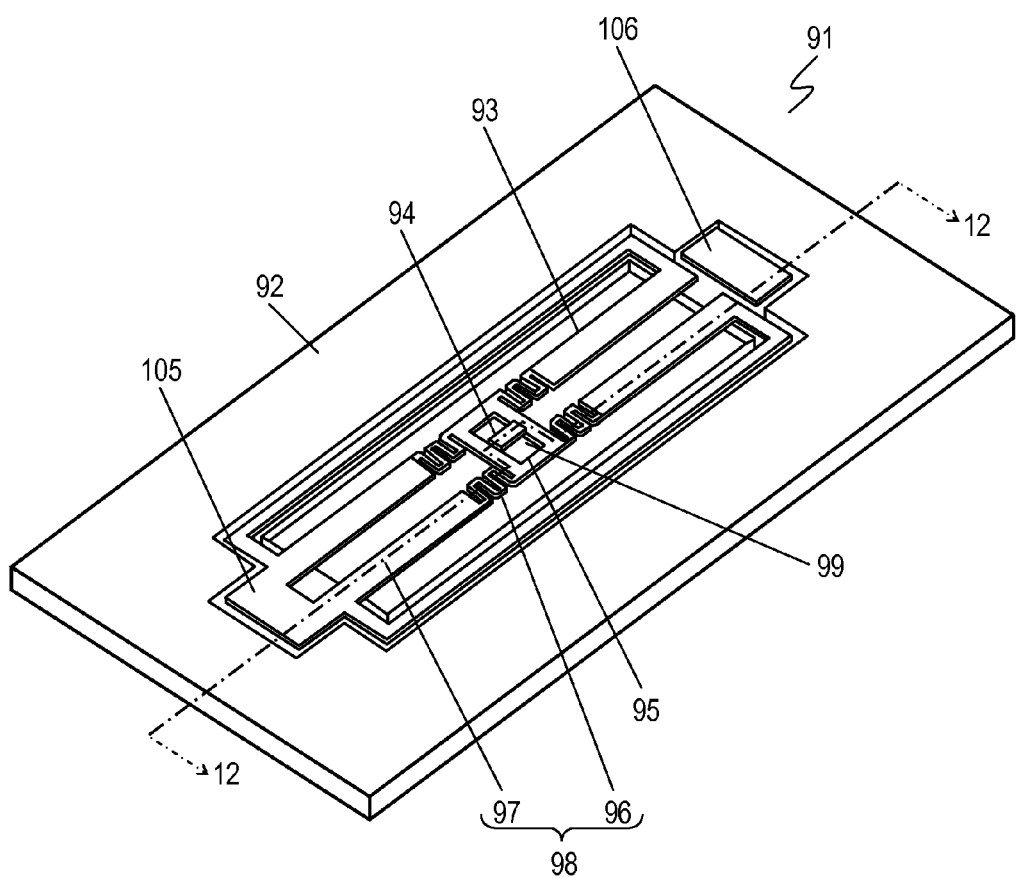
FIG. 11 is a perspective view of a piezoelectric actuator device in accordance with Exemplary Embodiment 6.

FIG. 11 is a perspective view of piezoelectric actuator device 91 in accordance with Exemplary Embodiment 6. Actuator device 91 is a mechanical switch device.

Piezoelectric actuator device 91 includes substrate 92 having through-hole 93 formed therein, transmission electrode 95 disposed above through-hole 93, and supporter 98 for supporting transmission electrode 95. Conductive section 94 functioning as a short-circuiting contact of a mechanical switch is provided on an upper surface of transmission electrode 95. Supporter 98 includes elastic section 96 and piezoelectric actuator 97 connected to elastic section 96. One end of elastic section 96 is connected to transmission electrode 95 and acts as a bridge to transmission electrode 95. One end of piezoelectric actuator 97 is connected to peripheral section 93*c* of through-hole 93 to support actuator 97. This structure allows supporter 98 to support transmission electrode 95 disposed above through-hole 93.

According to Embodiment 6, transmission electrode 95 has a rectangular shape, and two supporters 98 extend in parallel to each other from peripheral section 93*c* of through-hole 93. Elastic sections 96 of two supporters 98 support both opposite ends of transmission electrode 95. This structure allows transmission electrode 95 to be supported at both ends, thereby forming a bridge above through-hole 93.

Conductive section 94 is located substantially at a center of transmission electrode 95. Transmission electrode 95 has aperture 99 that surrounds conductive section 94. Transmission electrode 95 forms a bridge due to aperture 99, so that predetermined spaces are provided on both sides. A width of the bridge where no aperture 99 is formed is smaller than that of piezoelectric actuator 97.

Figure 12:
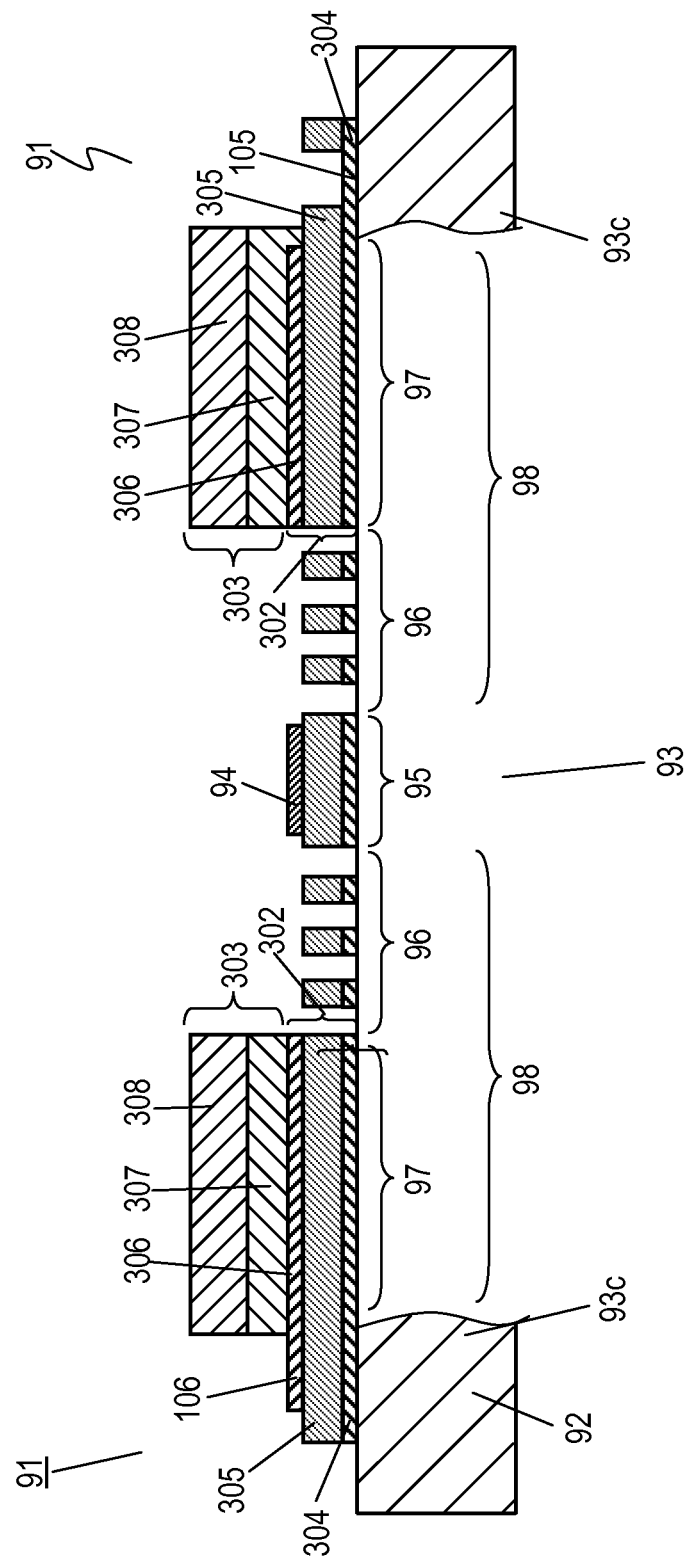
FIG. 12 is a sectional view of the piezoelectric actuator device at line 12-12 shown in FIG. 11.

FIG. 12 is a sectional view of piezoelectric actuator device 91 at line 12-12 shown in FIG. 11. Each of transmission electrode 95 and elastic section 96 that supports transmission electrode 95 includes lower electrode layer 304 and piezoelectric layer 305 provided on an upper surface of lower electrode layer 304. According to Embodiment 6, lower electrode layer 304 is made of platinum, and piezoelectric layer 305 is made of PTZ. Conductive section 94 provided on transmission electrode 95 is implemented by upper electrode layer 306 made of gold provided on an upper surface of piezoelectric layer 305.

Piezoelectric actuator 97 includes vibrator 303 and driver 302 provided on a lower surface of vibrator 303. Driver 302 includes lower electrode layer 304, piezoelectric layer 305 provided on an upper surface of lower electrode layer 304, and upper electrode layer 306 provided on an upper surface of piezoelectric layer 305. As discussed above, lower electrode layer 304 is made of platinum, piezoelectric layer 305 is made of PZT, and upper electrode layer is made of gold. Vibrator 303 includes lower vibration layer 307 provided on an upper surface of upper electrode layer 306 and upper vibration layer 308 provided on an upper surface of lower vibration layer 307. Lower electrode layer 304 includes external electrode 105 exposed from piezoelectric layer 305. Upper electrode layer 306 includes external electrode 106 exposed from vibrator 303. External electrodes 105 and 106 are provided on peripheral section 93*c* of through-hole 93 that supports supporter 98. A predetermined constant voltage is applied between lower electrode layer 304 and upper electrode layer 306 via external electrodes 105 and 106, and causes piezoelectric layer 305 to warp, thereby driving transmission electrode 95 bridging upward and downward. Conductive section 94 thus functions as a switch contact configured to be displaced by vibrator 303.

Elastic section 96 includes lower electrode layer 304 and piezoelectric layer 305 that form piezoelectric actuator 97. Elastic section 96 has a meandrous shape in view from above. Elastic section 96 functioning as a spring expands and shrinks to suppress a stress produced by the warping of actuator 97 applied to transmission electrode 95. Transmission electrode 95 can be thus moved repetitively upward and downward without breakage.

The shape of elastic section 96 is designed to have a resonance frequency thereof higher than an operating frequency of the switch, namely, higher than a frequency of the upward and downward movement. This structure allows transmission electrode 95 to move upward and downward at a desired speed free from resonance with transmission electrode 95. Piezoelectric actuator device 91 can thus operate in this condition. The width and the intervals between the fold-back portions of elastic section 96 are designed such that the width is smaller than the space between the actuators.

According to Embodiment 6, transmission electrode 95 is supported by piezoelectric actuators 97 at four sections via elastic sections 96. This structure reduces a variation of the warping amount of piezoelectric actuator 97 caused by the manufacturing process, and allows transmission electrode 95 to move upward and downward substantially in parallel to a transmission line without inclination.

Lower vibration layer 307 has a smaller longitudinal elastic modulus than upper vibration layer 308, and provides a large distance from a neutral plane of the warping to piezoelectric layer 305. A force generated in piezoelectric layer 305 can be thus efficiently converted into the warping. This structure increases the warping amount of piezoelectric actuator 97 while maintaining the stiffness of vibrator 303, accordingly lowering a driving voltage. This structure provides the actuator with a high natural frequency, and increases the warping amount at a frequency lower than the natural frequency. Piezoelectric actuator 97 thus can be driven with any driving waveform steadily, so that piezoelectric actuator device 91 can be used as a mechanical switch device in a variety of applications.

Figure 13:
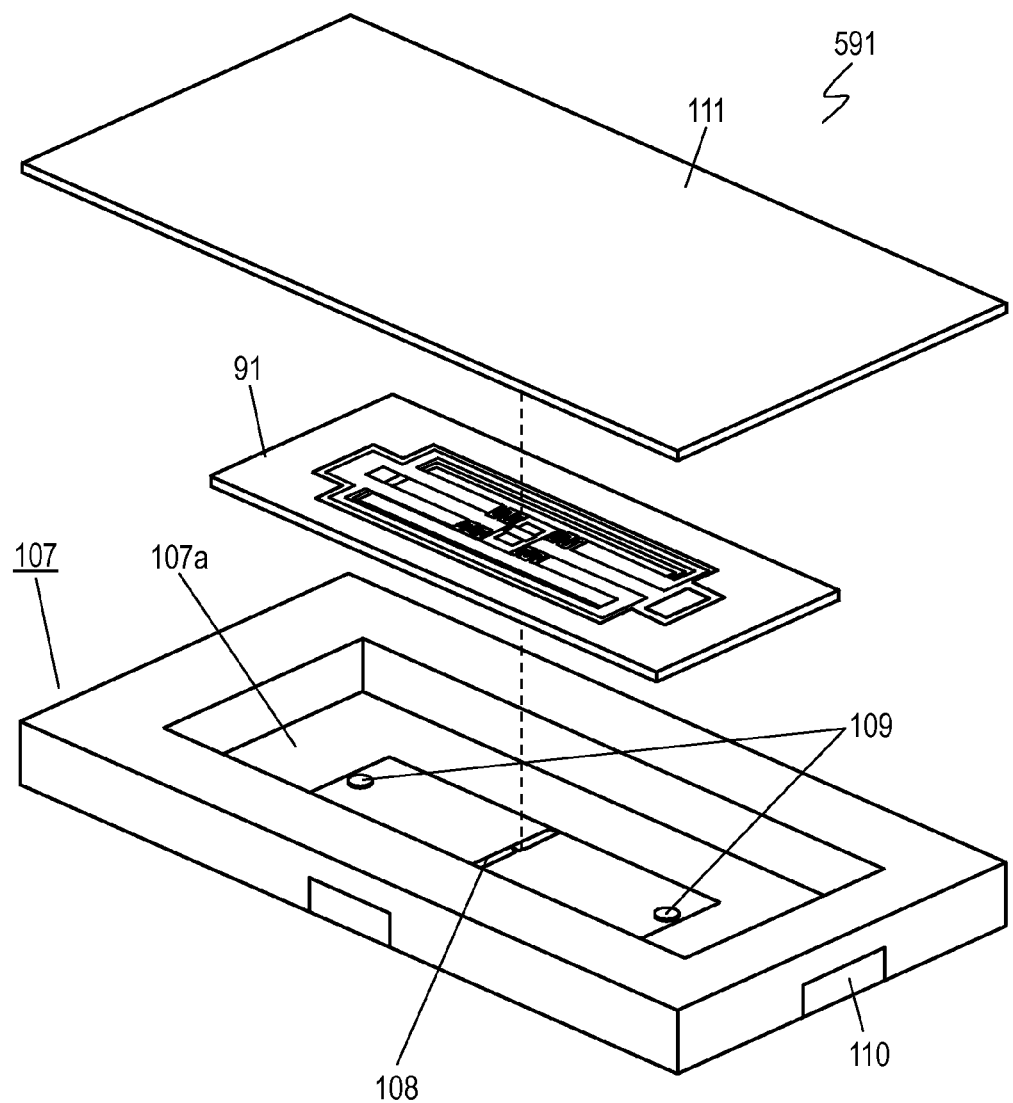
FIG. 13 is a perspective view of a mechanical switch including the piezoelectric actuator device in accordance with Embodiment 6.

FIG. 13 is an exploded perspective view of mechanical switch 591 operating at high frequencies. Piezoelectric actuator device 91, namely, a mechanical switch device, is installed into switch 591.

In mechanical switch 591, piezoelectric actuator device 91 is mounted in ceramic package 107 and sealed therein. Transmission line 108 and driving electrode 109 which is to apply a voltage to actuator device 91 is provided on bottom surface 107*a* of ceramic package 107 having actuator device 91 mounted thereon. Piezoelectric actuator device 91 is rigidly mounted to bottom surface 107*a* via, e.g. a spacer such that transmission line 108 faces transmission electrode 95 (conductive section 94) with a predetermined space between transmission line 108 and transmission electrode 95, and driving electrode 109 face external electrodes 105 and 106 at a predetermined space between driving electrode 109 and each of external electrodes 105 and 106. The position of the lower surface of transmission electrode 95 can be detected via through-hole 93 to detect the distance between transmission line 108 and transmission electrode 95, so that piezoelectric actuator device 91 can be accurately positioned and rigidly mounted onto bottom surface 107a.

Transmission line 108 and driving electrode 109 provided on bottom surface 107a are connected via a via-hole conductor or an inner wiring to external electrodes 110 provided on an outer surface of ceramic package 107. The actuator device is mounted into package 107, and then, is sealed with lid 111 made of Fe, Ni, or Co. Ceramic package 107 is finally filled with inert gas or dry air, or it can be sealed in a vacuum, thereby providing mechanical switch 591. Mechanical switch 591 is mounted onto a circuit board. Piezoelectric actuator device 91 provided in switch 591 is driven via external electrodes 110 on package 107 to switch the transmission line 108 at desired timing.

According to Embodiment 6, through-hole 93 is formed in substrate 92 by etching. In the case that transmission electrode 95 has a tolerance to the displacement thereof, through-hole 93 may be replaced with a recess having a bottom.

Piezoelectric actuator device 91 provides mechanical switch 591 which can switch the transmission line at a desired response speed without fail with a low, several volts.

In the above embodiments, terms, such as "upper surface", "lower surface", "upper vibration layer", "lower vibration layer", "upper electrode layer", and "lower electrode layer", indicating directions indicate relative directions depending only on the relative positional relations among the structural elements, such as the driver and vibrator, of the piezoelectric actuator device, and do not indicate absolute directions, such as a vertical direction.

INDUSTRIAL APPLICABILITY

A piezoelectric actuator device according to the present invention is excellent in anti-vibration performance and driving efficiency, hence being useful for a mobile application. The piezoelectric actuator device can be used as an optical reflecting device among others is beneficial to an image projector, such as a mobile projector or a head-mount display, with a small size.

REFERENCE MARKS 2, 42 Driver
3, 23, 43, 83, 303 Vibrator
4, 304 Lower Electrode Layer
5, 305 Piezoelectric Layer
7, 307 Lower Vibration Layer
8, 308 Upper Vibration Layer
11 Substrate
26, 306 Upper Electrode Layer
41f Frame
41m, 61m Mirror
61f Frame (Another Frame)
72 Driver (Another Driver)
73 Vibrator (Another Vibrator)
74 Lower Electrode Layer (Another Lower Electrode Layer)
75 Piezoelectric Layer (Another Piezoelectric Layer)
76 Upper Electrode Layer (Another Upper Electrode Layer)
77 Lower Electrode Layer (Another Lower Electrode Layer)
78 Upper Electrode Layer (Another Upper Electrode Layer)
81p Detector
94 Conductive Section
328 Middle Electrode Layer

The invention claimed is:

1. A piezoelectric actuator device comprising:
a vibrator including:
  a lower vibration layer configured to vibrate, and
  an upper vibration layer coupled to an upper surface of the lower vibration layer and configured to vibrate together with the lower vibration layer; and
a driver configured to vibrate the vibrator, the driver including:
  an upper electrode layer provided on a lower surface of the lower vibration layer,
  piezoelectric layer provided on a lower surface of the upper electrode layer, and
  a lower electrode layer provided on a lower surface of the piezoelectric layer, the driver being configured to vibrate the vibrator,
wherein the lower vibration layer of the vibrator is mainly made of certain organic material,
wherein the upper vibration layer of the vibrator is mainly made of certain inorganic material,
wherein the lower vibration layer has a smaller longitudinal elastic modulus than the upper vibration layer, and
wherein the lower vibration layer and the upper vibration layer are configured such that:
  the lower vibration layer is made of one or more first inorganic materials and one or more first organic materials including the certain organic material, and a total of volume ratios of volumes of the one or more first organic materials to a volume of the lower vibration layer is not smaller than $\frac{1}{3}$, and is larger than a volume ratio of a volume of each of the one or more first inorganic materials to the volume of the lower vibration layer; or
  the upper vibration layer is made of one or more second organic materials and one or more second inorganic materials including the certain inorganic material, and a total of volume ratios of volumes of the one or more second inorganic materials to a volume of the upper vibration layer is not smaller than $\frac{1}{3}$, and is larger than a volume ratio of each of volumes of the one or more second organic materials to the volume of the upper vibration layer.

2. The piezoelectric actuator device according to claim 1, wherein the vibrator further includes a middle electrode layer bonded to the upper surface of the lower vibration layer and a lower surface of the upper vibration layer,
wherein the middle electrode layer is made of piezoelectric polymeric material.

3. The piezoelectric actuator device according to claim 2, wherein the piezoelectric layer and the lower vibration layer are configured to be polarized in directions opposite to each other in response to an electric field, and
wherein the lower electrode layer and the middle electrode layer are configured to have an identical electric potential.

4. The piezoelectric actuator device according to claim 1, wherein the lower vibration layer is made of piezoelectric polymeric material, and
wherein the upper vibration layer is made of conductive material.

5. The piezoelectric actuator device according to claim 4, wherein the piezoelectric layer and the lower vibration layer are configured to be polarized opposite to each other in response to an electric field, and
wherein the lower electrode layer and the upper vibration layer are configured to have an identical electric potential.

6. The piezoelectric actuator device according to claim 1, wherein, in a case that the lower vibration layer is made of the one or more first inorganic materials and the one or more first organic materials, the total of the volume ratios of the volumes of the one or more first organic materials to the volume of the lower vibration layer exceeds 50%, and wherein, in a case that the upper vibration layer is made of the one or more second organic materials and the one or more second inorganic materials, the total of the volumes of the one or more second inorganic materials to the volume of the upper vibration layer exceeds 50%.

7. The piezoelectric actuator device according to claim 1, further comprising:
a frame supporting one end of the vibrator; and
a mirror supported by another end of the vibrator,
wherein the vibrator has a meandrous shape.

8. The piezoelectric actuator device according to claim 1, further comprising:
a first frame supporting one end of the vibrator;
a second frame supported by another end of the vibrator;
a further vibrator having one end supported by the second frame; and
a mirror supported by another end of the further vibrator,
wherein the vibrator and the further vibrator have meandrous shapes.

9. The piezoelectric actuator device according to claim 8, further comprising:
a further driver configured to drive the further vibrator,
wherein the further vibrator includes:
    a further lower vibration layer configured to vibrate, and
    a further upper vibration layer coupled to an upper surface of the further lower vibration layer, the further upper vibration layer being configured to vibrate together with the further lower vibration layer,
wherein the further driver includes:
    a further upper electrode layer provided on a lower surface of the further lower vibration layer,
    a further piezoelectric layer provided on a lower surface of the further upper electrode layer, and
    a further lower electrode layer provided on a lower surface of the further piezoelectric layer,
wherein the further lower vibration layer of the further vibrator is mainly made of organic material,
wherein the further upper vibration layer of the further vibrator is mainly made of inorganic material, and
wherein the further upper vibration layer has a smaller longitudinal elastic modulus than the further lower vibration layer.

10. The piezoelectric actuator device according to claim 1, further comprising a detector for detecting a distortion of the vibrator.

11. The piezoelectric actuator device according to claim 1, further comprising a conductive section functioning as a switch contact configured to be displaced by the vibrator.

12. A method for manufacturing a piezoelectric actuator device, comprising:
forming a driver which includes a lower electrode layer provided on an upper surface of a substrate, a piezoelectric layer provided on an upper surface of the lower electrode layer, and an upper electrode layer provided on an upper surface of the piezoelectric layer;
forming a lower vibration layer mainly made of certain organic material on an upper surface of the upper electrode layer of the driver by a photo-crosslinking reaction with use of photosensitive elastic resin; and
forming an upper vibration layer mainly made of certain inorganic material on an upper surface of the lower vibration layer by a plating method,
wherein the lower vibration layer has a smaller longitudinal elastic modulus than the upper vibration layer, and
wherein the lower vibration layer and the upper vibration layer are configured such that:
    the lower vibration layer is made of one or more first inorganic materials and one or more first organic materials including the certain organic material, and a total of volume ratios of volumes of the one or more first organic materials to a volume of the lower vibration layer is not smaller than $\frac{1}{3}$, and is larger than a volume ratio of a volume of each of the one or more first inorganic materials to the volume of the lower vibration layer; or
    the upper vibration layer is made of one or more second organic materials and one or more second inorganic materials including the certain inorganic material, and a total of volume ratios of volumes of the one or more second inorganic materials to a volume of the upper vibration layer is not smaller than $\frac{1}{3}$, and is larger than a volume ratio of each of volumes of the one or more second organic materials to the volume of the upper vibration layer.

13. The method according to claim 12, further comprising removing a portion of the driver by etching.

14. The method according to claim 12, further comprising removing a portion of the substrate contacting the driver by etching the substrate from a lower surface of the substrate.

* * * * *